United States Patent [19]
Machado et al.

[11] Patent Number: 5,098,865
[45] Date of Patent: Mar. 24, 1992

[54] HIGH STEP COVERAGE SILICON OXIDE THIN FILMS

[76] Inventors: Jose R. Machado, 2805 Windy Hill Rd., Allentown, Pa. 18103; Terry A. Francis, 1535 Shaw Dr.; Hans P. W. Hey, 1483 Myrtle Ave., both of San Jose, Calif. 95118

[21] Appl. No.: 738,065

[22] Filed: Jul. 30, 1991

Related U.S. Application Data

[63] Continuation-in-part of Ser. No. 430,832, Nov. 2, 1989, abandoned.

[51] Int. Cl.$^5$ ............................................. H01L 21/02
[52] U.S. Cl. ..................................... 437/238; 437/235; 437/173; 148/DIG. 118
[58] Field of Search .................. 437/238, 173, 235; 148/DIG. 118

[56] References Cited

U.S. PATENT DOCUMENTS 4,759,993  7/1988  Pai et al. .............................. 427/39

FOREIGN PATENT DOCUMENTS 0215731  12/1984  Japan .
0230026  10/1987  Japan .
0241176  10/1988  Japan .

OTHER PUBLICATIONS

S. M. Sze, "VLSI Technology"; 1983; pp. 93-129.
Shirafuji et al., "Thin Solid Films"; 1988 V:157:A, 105-15.
Chapple-Sokol et al., "Mater. Res. Soc. Symp. Proc."; 1988 V105, 127-32.
Tanaka et al; "Pro.-Electrochem. Soc."; 1988; V; 88-7, Proc Symp. Dry Process, 1987: 247-54.
Ahmed et al., "Thin Solid Films", 1877, 148, L63-L65.

*Primary Examiner*—Brian E. Hearn
*Assistant Examiner*—Trung Dang
*Attorney, Agent, or Firm*—James C. Simmons; William F. Marsh

[57] ABSTRACT

A process for preparing high step coverage silicon dioxide coatings on semiconductor wafers comprising the placing of the wafer to be coated in a process chamber, introducing disilane and nitrous oxide into the process chamber and maintaining the wafer in an atmosphere consisting essentially of a gaseous mixture of disilane and nitrous oxide and initiating and maintaining plasma enhanced chemical vacuum deposition of silicon dioxide from said gaseous mixture by applying radio frequency energy to the wafer to create a plasma adjacent the surface of said wafer is disclosed.

5 Claims, 2 Drawing Sheets

HIGH STEP COVERAGE SILICON OXIDE THIN FILMS

This Application is a Continuation-in-Part of U.S. Patent Application Serial No. 07/430,832 filed Nov. 2, 1989, now abandoned.

FIELD OF THE INVENTION

This invention relates to the manufacture of semiconductor devices and, specifically, to the deposition of high step coverage silicon oxide films in the manufacture of semiconductor devices, and the like.

BACKGROUND OF THE INVENTION

It is standard practice in the manufacture of many semiconductor devices, and other devices, to provide a thin passive layer or coating of a chemically nonreactive or low reactivity material to protect the semiconductor junctions and layers from degradation by contact with oxygen, fumes in the air, moisture, etc., and from damage by contact during packaging and handling and to stabilize the electrical characteristics of the device.

The advent of submicron integrated circuit devices have, however, created a need for better step coverage that has been available in the prior art. This invention provides a method for producing such high step coverage films, providing thin conformal dielectric films suitable for use in submicron integrated circuit fabrication.

The general prior art technology in the production of silicon oxide coatings to semiconductor devices and to other devices is well known, and there is considerable literature on the subject. The general principles underlying the formation of thin films are described in HANDBOOK OF THIN FILM TECHNOLOGY, Maissel, Leon I. and Glang, Reinhard, editors, McGraw Hill Book Company, New York, 1970, and the general technology for processing silicon-based semiconductor devices in described in SILICON PROCESSING FOR THE VLSI ERA, Wolf, Stanley, and Talbert, Richard N., editors, Lattice Press, Sunset Beach, California, 1986, which includes a discussion of thin film technology.

The chemistry of silanes generally and of disilanes in particular is described in the prior art. See, for example, Arkles, B., Peterson, W. R., Jr., KIRK-OTHMER ENCYCLOPEDIA OF CHEMICAL TECHNOLOGY. 3rd ed. Vol. 20.887-911.

A large variety of "thin films" are used in the fabrication of Very Large Scale Integration (VLSI) devices. These films may be thermally grown or deposited from the vapor phase. They can be metals, semiconductors, or insulators.

Thin films for use in VLSI fabrication must satisfy a large set of rigorous chemical, structural, and electrical requirements. Film composition and thickness must be strictly controlled to facilitate etching of submicron features. Very low densities of both particulate defects and film imperfections, such as pinholes, become critical for the small line widths, high densities, and large areas necessary for VLSI. These small geometries also create highly rugged topography for overlying films to cover. Therefore, excellent adhesion, low stress, and conformal step coverage are required of a VLSI thin film, and its own surface topography should reduce or even planarize the underlying steps if possible. Finally, non-conducting thin films must have low dielectric constants to reduce parasitic capacitances exacerbated by the scaled down film thicknesses.

The formation of such films is accomplished by a large variety of techniques, but which can conceptually be divided into two groups: 1) film growth by interaction of a vapor-deposited species with the substrate; and 2) film formation by deposition without causing changes to the substrate material. The first category includes thermal oxidation and nitridation of single crystal silicon and polysilicon and the formation of silicides by direct reaction of a deposited metal and the substrate.

The second group includes another three subclasses of deposition: a) chemical vapor deposition, CVD, in which solid films are formed on a substrate by the chemical reaction of vapor phase chemicals that contain the required constituents; b) physical vapor deposition, or PVD, in which the species of the thin film are physically dislodged from a source to form a vapor which is transported across a reduced pressure region to the substrate, where it condenses to form the thin film; and c) coating of the substrate with a liquid, which is then dried to form the solid thin film. When CVD process are used to form single-crystal thin films, the process is termed epitaxy. The formation of thin films by PVD includes the processes of sputtering and evaporation.

Thin films generally have smaller grain size than do bulk materials. Grain size is a function of the deposition conditions and annealing temperatures. Larger grains are observed for increased film thickness, with the effect increasing with increasing substrate or deposition temperature. The initial deposition temperature plays an important role in determining the final grain size. The dependence on deposition rate is due to the fact that even if clusters have high mobility, at high deposition rate they are quickly buried under subsequent layers. For very high deposition rates, the heat of condensation can raise the substrate temperature, thereby producing increased grain size from thermal effects.

Nearly all films are found to be in a state of internal stress, regardless of the means by which they have been produced. The stress may be compressive or tensile. Compressively stressed films would like to expand parallel to the substrate surface, and in the extreme, films is compressive stress will buckle up on the substrate. Films in tensile stress, on the other hand, would like to contract parallel to the substrate, and may crack if their elastic limits are exceeded. In general, the stresses in thin films are in the range of $10^8 - 5 \times 10^{10}$ dynes/cm$^2$. Highly stressed films are generally undesirable for VLSI applications for several reasons, including: a) they are more likely to exhibit poor adhesion; b) they are more susceptible to corrosion; c) brittle films, such as inorganic dielectrics, may undergo cracking in tensile stress; and d) the resistivity of stressed metallic films is higher than that of their annealed counterparts.

The intrinsic stress reflects the film structure in ways not yet completely understood. It has been observed that the intrinsic stress in a film depends on thickness, deposition rate, deposition temperature, ambient pressure, method of film preparation, and type of substrate used, among other parameters. At low substrate temperatures, metal films tend to exhibit tensile stress. This decreases with increasing substrate temperature, often in a linear manner, finally going through zero or even becoming compressive. The changeover to compressive stress occurs at lower temperatures for lower melting point metals.

A Chemical Vapor Deposition (CVD) process can be summarized as consisting of the following sequence of steps:
a) a given composition and flow rate of reactant gases and diluent inert gases is introduced into a reaction chamber; b) the gas species move to the substrate; c) the reactants are adsorbed on the substrate; d) the adatoms undergo migration and film-forming chemical reactions, and e) the gaseous byproducts of the reaction are desorbed and removed from the reaction chamber. Energy to drive the reactions can be supplied by several methods, e.g. thermal, photons, or electrons, with thermal energy being the most commonly used.

In practice, the chemical reactions of the reactant gases leading to the formation of a solid material may take place not only on or very close to the wafer surface, a heterogeneous reaction, but also in the gas phase, a homogeneous reaction. Heterogeneous reactions are much more desirable, as such reactions occur selectively only on heated surfaces, and produce good quality films. Homogeneous reactions, on the other hand, are undesirable, as they form gas phase clusters of the depositing material, which can result in poorly adhering, low density films, or defects in the depositing film. In addition, such reactions also consume reactants and can cause decreases in deposition rates. Thus, one important characteristic of a chemical reaction for CVD application is the degree to which heterogeneous reactions are favored over gas phase reactions.

Since the aforementioned steps of a CVD process are sequential, the one which occurs at the slowest rate will determine the rate of deposition. The steps can be grouped into 1) gas-phase processes, and 2) surface processes. The gas phenomenon of interest is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas, D, and concentration gradient across the boundary layer. The rate of mass transport is only relatively weakly influenced by temperature.

Several surface processes can be important once the gases arrive at the hot substrate surface, but the surface reaction, in general, can be modeled by a thermally activated phenomenon which proceeds at a rate which is a function of the frequency factor, the activation energy, and the temperature. The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport, no matter how high the temperature is increased. This situation is referred to as a mass-transport limited deposition process.

CVD systems usually contain the following components: a) gas sources; b) gas feed lines; c) mass-flow controllers for metering the gases into the system; d) a reaction chamber or reactor; e) a method for heating the wafers onto which the film is to be deposited, and in some types of systems, for adding additional energy by other means; and f) temperature sensors. LPCVD and PECVD systems also contain pumps for establishing the reduced pressure and exhausting the gases from the chamber.

The design and operation of CVD reactors depends on a variety of factors, and hence they can be categorized in several ways. The first distinction between reactor types is whether they are hot-wall or cold-wall reactors, and this is dependent on the method used to heat the wafers. The next criterion used to distinguish reactor types is their pressure regime of operation atmospheric pressure or reduced pressure reactors. Finally, the reduced pressure group is split into: a) low-pressure reactors the so called low-pressure CVD, or LPCVD reactors, in which the energy input is entirely thermal; and b) those in which energy is partially supplied by a plasma as well known as plasma-enhanced CVD, or PECVD reactors. Each of the reactor types in the two pressure regimes are further divided into sub-groups, defined by reactor configuration and method of heating.

TABLE I

Characteristics and Applications of CVD Reactors

| Process | Advantages | Disadvantages | Applications |
| --- | --- | --- | --- |
| APCVD Low Temperature | Simple Reactor, Fast Deposition, Low Temperature | Poor Step Coverage, Particle Contamination | Low Temperature Oxides, both doped and undoped |
| LPCVD | Excellent Purity and Uniformity, Conformal Step Coverage, Large Wafer Capacity | High Temperature Low Deposition Rate | High Oxides, both doped and Nitride, Poly —Si, W, WSI$_2$ |
| PECVD | Low Temperature, Fast Deposition, Good Step Coverage | Chemical, e.g. H$_2$ and Particulate Contamination | Low Temperature Insulators over Metals, Passivation-Nitride |

Plasma enhanced CVD, or PECVD uses an rf-induced glow discharge to transfer energy into the reactant gases, allowing the substrate to remain at a lower temperature than in APCVD or LPCVD processes. Lower substrate temperature is the major advantage of PECVD, and in fact, PECVD provides a method of depositing films on substrates that do not have the thermal stability to accept coating by other methods, the most important being the formation of silicon nitride and SiO$_2$ over metals. In addition, PECVD can enhance the deposition rate when compared to thermal reactions alone, and produce films of unique compositions and properties. Desirable properties such as good adhesion, low pinhole density, good step coverage, adequate electrical properties, and compatibility with fineline pattern transfer processes, have led to application of these films in VLSI.

The plasma, also referred to as a glow discharge, which is defined as a partially ionized gas containing an equal number of positive and negative charges, as well as some other number of non-ionized gas particles is generated by the application of a radio frequency field to a low pressure gas, thereby creating free electrons within the discharge region. The electrons gain sufficient energy from the electric field so that when they collided with gas molecules, gas-phase dissociation and ionization of the reactant gases, e.g. silane and nitrogen or oxygen-containing species then occurs.

The energetic particles used to strike target materials to be sputtered in VLSI sputter deposition systems are generated by glow-discharges.

The energetic species are then adsorbed on the film surface. The radicals tend to have high sticking coefficients, and also appear to migrate easily along the surface after adsorption. These two facts can lead to excellent film conformality. Upon being adsorbed on the substrate, they are subjected to ion and electron bombardment, rearrangements, reactions with other adsorbed species, new bond formations and film formation and growth. Adatom rearrangement includes the diffusion of the adsorbed atoms onto stabile sites and concurrent desorption of reaction products. Desorption rates are dependent on substrate temperature, and higher temperatures produce films with fewer entrapped by-products. Gas-phase nucleation should be avoided to reduce particulate contamination.

A plasma process requires control and optimization of several deposition parameters besides those of an LPCVD process, including rf power density, frequency, and duty cycle. The deposition process is dependent in a very complex and interdependent way on these parameters, as well as on the usual parameters of gas composition, flow rates, temperature, and pressure. Furthermore, as with LPCVD, the PECVD method is surface reaction limited, and adequate substrate temperature control is thus necessary to ensure film thickness uniformity.

Chemical vapor deposited (CVD) $SiO_2$ films, and their binary and ternary silicates, find wide use in VLSI processing. These materials are used as insulation between polysilicon and metal layers, between metal layers in multilevel metal systems, as getters, as diffusion sources, as diffusion and implantation masks, as capping layers to prevent outdiffusion, and as final passivation layers. In general, the deposited oxide films must exhibit uniform thickness and composition, low particulate and chemical contamination, good adhesion to the substrate, low stress to prevent cracking, good integrity for high dielectric breakdown, conformal step coverage for multilayer systems, low pinhole density, and high throughput for manufacturing.

CVD silicon dioxide is an amorphous structure of $SiO_4$ tetrahedra with an empirical formula $SiO_2$. Depending on the deposition conditions, CVD silicon dioxide may have lower density and slightly different stoichiometry from thermal silicon dioxide, causing changes in mechanical and electrical film properties, such as index of refraction, etch rate, stress, dielectric constant and high electric-field breakdown strength. Deposition at high temperatures, or use of a separate high temperature post-deposition anneal step, referred to as densification can make the properties of CVD films approach those of thermal oxide.

Deviation of the CVD silicon dioxide film's refractive index, n, from that of the thermal $SiO_2$ value of 1.46 is often used as an indicator of film quality. A value of n greater than 1.46 indicates a silicon rich film, while smaller values indicate a low density, porous film. CVD $SiO_2$ is deposited with or without dopants, and each type has unique properties and applications.

$SiO_2$ can also be deposited by a plasma enhanced reaction between $SiH_4$ and $N_2O$, nitrous oxide or $O_2$ at temperatures between 200–400° C.

$$SiH_4 + 2N_2O \xrightarrow{200-400°\ C.,\ rf} SiO_2 + 2N_2 + 2H_2$$

There are multitudinous publications and patents which describe the prior art silane-nitrous oxide processes which, as pointed out above, result in poor conformal films not fully suited to submicron integrated circuit devices in which high step coverage is essential.

Nitrogen and/or hydrogen is often incorporated in PECVD $SiO_2$. A low ratio of $N_2O/SiH_4$ will increase the index of refraction, due to large amounts of nitrogen incorporated in the film and the formation of silicon rich films. Nearly stoichiometric, n = 1.46, plasma oxide films can be achieved by reacting $SiH_4$, and $O_2$ mixtures. The buffered HF etch rate is a sensitive measure of the film's stoichiometry and density. Lower deposition temperatures and higher $N_2O/SiH_4$ ratios lead to less dense films and faster etch rates. As with nitride films, PECVD oxides also contain 2-10% $H_2$ in the form of Si—H, Si—O—H, and H—O—H. The hydrogen concentration is a strong function of the deposition parameters. Low deposition temperatures, high rf power, and high carrier-gas flow rates are required to prevent gas phase nucleation and its attendance particulate problems.

Plasma oxide films are generally deposited in compressive stress, with values ranging between $1 \times 10^8$ – $4 \times 10^9$ dynes/cm$^2$, depending on deposition temperature and rate. Dielectric strengths of $4-8 \times 10^6$ V/cm, and dielectric constants ranging from 4-5 have been obtained. Low pinhole counts have been obtained with PECVD oxides, as have very conformal coatings. Adhesion to metal is also reported to be excellent.

Many treatises, texts and a massive volume of technical journal literature describe in more detail the background of the technology in which this invention lies; see, for example, Thomas, HANDBOOK OF TRANSISTORS, SEMICONDUCTORS, INSTRUMENTS AND MICROELECTRONICS, Prentice Hall, Englewood Cliffs, N.J. 1968 and the extensive publications of the J. C. Schumacher Company, e.g. *Tetraethyl Orthosilicate* (TEOS), Product Data Sheet No. 6; *Tetraethyl Orthosilicate for Semiconductor High Temperature Silicon Dioxide Depositions*. Product Application Note No. 8; *TEOS and Liquid Dopant Sources for CVD SiO₂ PSG, and BPSG*, Product Application Note No. 15; Adams and Capio, *The Decosition of Silicon Dioxide Films at Reduced Pressure*, Technical Article Reprint No. 5.

Shirafuju, Junji; Miyoshi, Satoru; Aoki, Hidemitsu Thin Solid Films, 1988 V: 157:1, 105-15, describe amorphous silicon oxide films prepared by laser-induced chemical vapor deposition from nitrous oxide and disilane.

Chapple-Sokol, Jonathan D.; Giunta, Carmen J.; Gordon, Roy G. 1988 Mater. Res. Soc. Symp. Proc. V 105, 127-32 describe the kinetics of silicon oxide thin film deposition from silane and disilane with nitrous oxide at atmospheric pressure.

Stoichiometry control in laser CVD of silica by laser-induced deposition from disilane-nitrous oxide mixtures is described by Tanaka, Takeshi; Nakano, Hiroaki; Hirose, Masataka Proc—Electrochem. Soc. 1988 V: 88-7, Proc. Symp. Dry Process, 1987: 247-54.

Ahmed, W. & Meakin, W., Thin Solid Films, 148, L63-L65 (1987) describe a hot wall LPCVD method for depositing doped silicon films from disilane.

The formation of silicon dioxide film by photochemical deposition from disilane and nitrous oxide are described in Japanese patent No. 84215731 A2.

Silicon oxides for interlayer dielectrics have been deposited using three main processes:

(a) Low temperature oxide films formed by the reaction of silane with oxygen at temperature between 300 and 500° C. in low pressure chemical vapor deposition.

(b) Plasma oxides, i.e. oxide films formed by plasma enhanced deposition of silane and organosilanes such as tetraethylorthosilicate (TEOS) and 1,3,5,7-tetramethylcyclotetrasiloxane and an oxygen source, e.g. oxygen, ozone or nitrous oxide. (c) Atmospheric pressure oxides, i.e. silicon oxides deposited by atmospheric pressure chemical vapor deposition from silane, disilane and tetraethylorthosilicate and an oxygen source, e.g. oxygen.

While these processes are capable of producing oxides with good electrical properties, these processes are not entirely satisfactory for use in the manufacture of submicron electronic devices which need high step coverage, i.e. above 80%, thin films deposited at temperatures below 400° C. for very tight spacings, i.e. down to 0.6 microns.

It has now been discovered that disilane-nitrous oxide mixtures energized as described hereinafter produce a most unexpected and new result, namely a high step coverage conformal film of silicon oxide which is suitable for use in the manufacture of submicron integrated circuit devices, the process being carried out at temperatures sufficiently low to permit its use on aluminum layers in multilevel schemes.

SUMMARY OF THE INVENTION

The invention is an improved process for preparing high step coverage silicon dioxide coatings on semiconductor wafers in the manufacture of semiconductor devices. A semiconductor wafer to be coated is placed in a process chamber, which is evacuated and purged to remove contaminants in the chamber and on the surface of the wafer. Disilane and nitrous oxide are introduced into the process chamber at a rate sufficient to maintain the wafer in an atmosphere consisting essentially of a gaseous mixture of disilane and nitrous oxide, and plasma enhanced chemical vapor deposition of silicon dioxide from said gaseous mixture is initiated by applying radio frequency energy to the wafer to create a plasma adjacent the surface of the wafer.

DESCRIPTION OF THE PREFERRED EMBODIMENT

Figure 1:
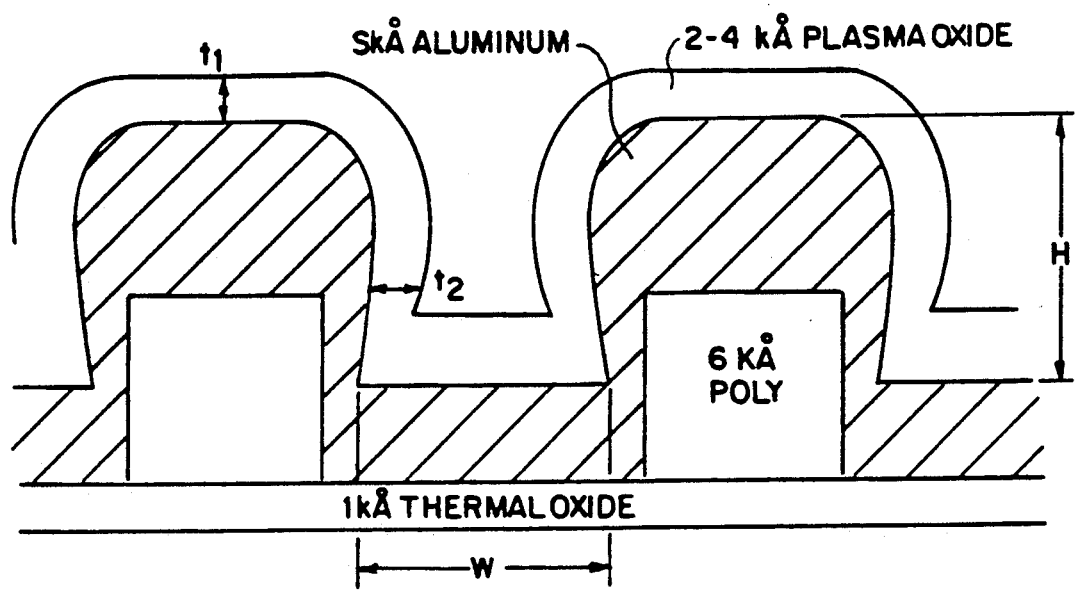
FIG. 1 is a schematic representation of a photomicrograph of a portion of a semiconductor depicting the general configuration of a chemical vapor deposited coating of silicon dioxide and the manner of measuring step coverage.

The process of this invention comprises depositing high step coverage silicon dioxide from the reaction of disilane, $H_3$—Si—Si—$H_3$, and nitrous oxide in a single wafer plasma $H_3$-Si-Si-H enhanced chemical vapor deposition reactor. More importantly, the invention pertains to deposition of the coating on silica wafers having surface discontinuities with an aspect ratio of between 1.5 and 2.0. Aspect ratio as used herein defines how severe the topography is on the surface of the wafers. Referring to FIG. 1, aspect ratio is the ratio of the width (W) to the height (H) of the aluminum step to be covered. Therefore, a low value (e.g. 1.5 to 2.0) defines a severe topography and a high value (e.g. 5.0) defines a less severe topography.

The reactor comprises a convention "shower head" diffusing head, heated susceptor, 13.56 MHz RF power supply and an automatic tuning network, all of which are well known in the art.

Disilane flow into the reactor is controlled using any of the commercially available mass flow controllers. In the comparative tests described below, silane was introduced in the same manner as the disilane, and tetraethylorthosilicate was heated to 70° C. and controlled through two needle valves.

In the comparative tests described, thin films were deposited on P-type <100> silicon test wafers and step coverage test structure which simulates a window opening. The worst case aspect ratio for a first level metal was simulated in these comparisons evaluations. The structure used in these evaluations comprised a 0.6 micron thick polysilicon layer patterned over a thin 1000 angstrom thermal oxide layer with lines and spaces ranging in width from 0.6 to 10 microns covered with a blanket 0.5 micron aluminum layer to simulate the poor sputter step coverage typically observed in contact windows.

Bare silicon wafers and the test structure described were loaded into the reactor and brought to susceptor temperature. The heat-up and pump down took approximately 10 minutes. The reagent gases, i.e. disilane and nitrous oxide in the inventive process, silane or tetraethylorthosilicate and oxygen and nitrous oxide in the comparative processes, were introduced and allowed to stabilize for ten seconds at which time the deposition was initiated by applying the radio frequency field. After the deposition was complete, the chamber was evacuated, purged and back-filled with nitrogen. The processed wafers were then removed.

The exemplary plasma activated process is carried out at temperatures from approximately 200 to approximately 400° C., at pressures from 1 to approximately 3.0 torr, rf power applied at 0.04 to approximately 0.12 watts per $cm^2$ (W/$cm^2$). Disilane comprised approximately one-half percent of the total flow, e.g. 18 standard cubic centimeters per minutes (sscm) of disilane and 3660 sscm of nitrous oxide, i.e. the disilane-to-nitrous oxide ratio in the atmosphere is about 1 part of disilane to 203 parts of nitrous oxide, by volume. If the process parameters fail greatly outside those given, the refractive index of the deposited film may become too high, above about 1.52, or too low, below about 1.48.

Disilane - nitrous oxide reagent mixtures may be employed to deposit silicon dioxide films using other chemical vapor deposition technologies, e.g. LPCVD, APCVD, laser activated CVD, etc., but the inventive process has the most immediate and beneficial effect in plasma activated chemical vapor deposition.

Step coverage for the previously described inventive process and the comparative processes was measured by industry standard photomicrographic techniques.

Figure 2:
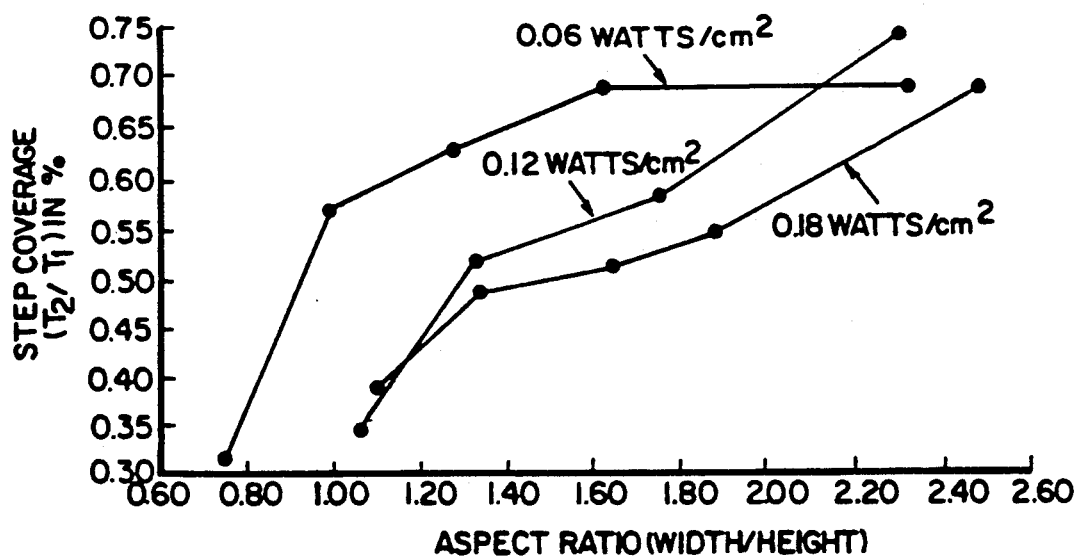
FIG. 2 depicts the results of a comparative test showing the step coverage versus aspect ratio using a silane-nitrous oxide mixture, showing step coverage versus aspect ratio as a function of RF power density.
Figure 3:
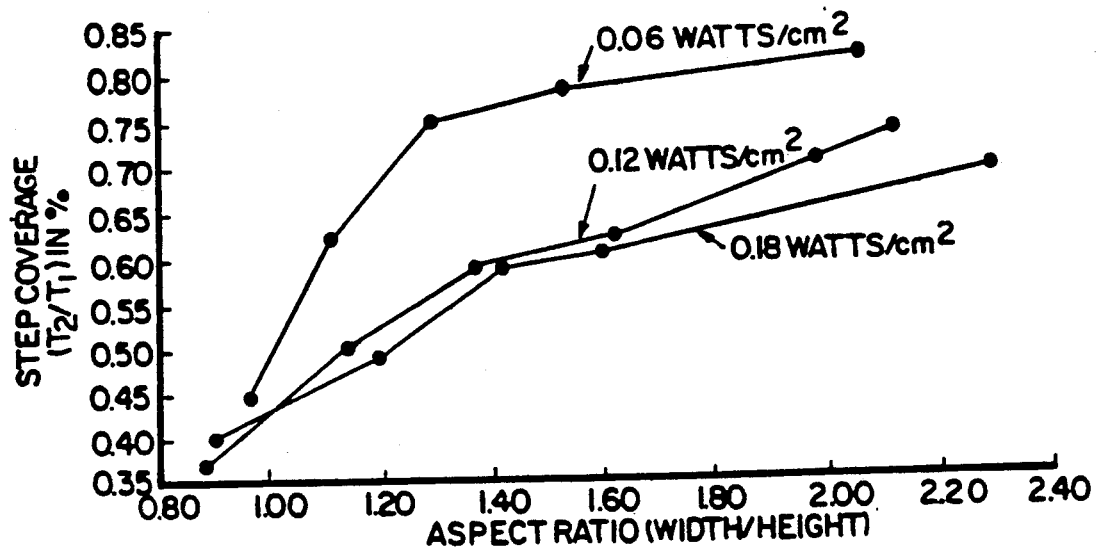
FIG. 3 depicts the results of a comparative test showing the step coverage versus aspect ratio using a disilane-nitrous oxide mixture, showing step coverage versus aspect ratio as a function of RF power density.
Figure 4:
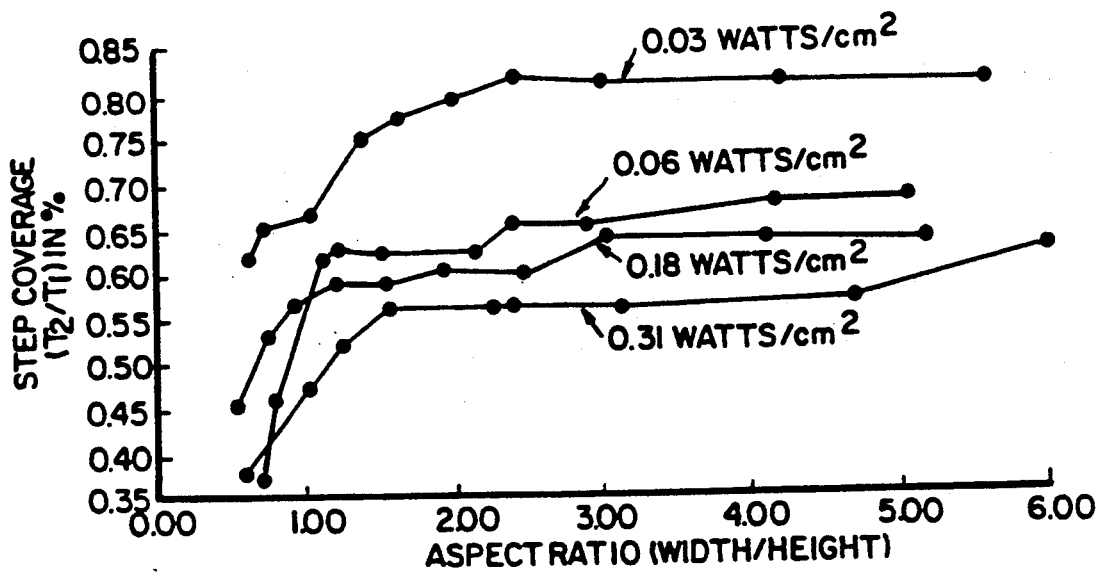
FIG. 4 depicts the results of a comparative test showing the step coverage versus aspect ratio using a TEOS-oxygen mixture, showing step coverage versus aspect ratio as a function of RF power density.

The results of the described comparisons are depicted graphically in FIGS. 2, 3 and 4.

The thickness of the thin film oxide was 2000 to 4000 angstroms. The top-to-sidewall thickness ratio (step coverage) was measured for spacings from 0.6 to 2 microns, and the data averaged over a range of spacings to smooth out the measurement noise.

Analysis of the data depicted in the figures established that the step cover of disilane-produced silicon dioxide is better than of silane-produced silicon dioxide or tetraethylorthosilicate-produced silicon dioxide. In particular, for energy levels of 0.04 W/cm$^2$ to 0.12 W/cm$^2$ better step coverage is effected for the process of the invention (FIG. 3) than with, prior art processes (FIGS. 2 and 4). An energy level of 0.03 W/cm$^2$ is not practical for use in depositing films. The process of the present invention maximizes step coverage for aspect ratios between 1.5 and 2.0 as shown by the data plotted in FIGS. 2, 3 and 4. Presumably, the reactive sticking coefficient of disilane is higher than that of silane, a lower molecular weight reagent, and also that of tetraethylorthosilicate, a higher molecular weight reagent. The disilane molecules, or active radicals, cover the deposition surface more uniformly than has been achieved in the prior art processes. Just why this unexpected improvement accrues from the invention is not fully understood.

As shown by the data presented above and in FIGS. 2, 3 and 4, the invention provides an important and unexpected improvement in the art. While the present practices in the industry were, before the advent of submicron integrated circuit devices, adequate for most production requirements, such practices, including prior art plasma processes which gave the best step coverage, did not give reliable high step coverage such as is now required in submicron IC devices. The present invention solves this problem and opens the way for further advances in IC technology, permitting step coverages above 80% for silicon oxides which were not attainable using prior art methods.

Industrial Application

This invention is useful in the manufacture of semiconductor devices generally and, more particularly, in the manufacture of integrated circuit devices.

Having thus described our invention what is desired to be secured by Letters Patent of the United States is set forth in the appended claims.

What is claimed is:

1. The process for preparing high step coverage silicon dioxide coatings on semiconductor wafers in the manufacture of semiconductor devices comprising the steps of:

placing a silicon semiconductor wafer having surface discontinuities with a width/height aspect ratio of between 1.5 and 2.0 to be coated in a process chamber;

heating the wafer in the process chamber to a temperature of from about 200° C,. to about 400° C., and maintaining said temperature during the deposition of silicon dioxide;

maintaining the pressure in the process chamber at from about 1 to 3 torr during the deposition of silicon dioxide;

introducing a mixture consisting essentially of disilane and nitrous oxide into the process chamber and maintaining the wafer in an atmosphere consisting essentially of a gaseous mixture of disilane and nitrous oxide; and initiating and maintaining plasma enhanced chemical vapor deposition of silicon dioxide from said gaseous mixture by applying radio frequency energy at about 0.04 W/cm$^2$ to 0.12 W/cm$^2$ to the wafer to create a plasma adjacent the surface of said wafer to produce. a coating having a high step coverage of at least 0.55 at an aspect ratio on the wafer between 1.5 and 2.0.

2. The process of claim 1 wherein the atmosphere is maintained by introducing disilane at the rate of about 18 standard cubic centimeters per minute per wafer and nitrous oxide at the rate of about 3660 standard cubic centimeters per minute per wafer.

3. The process of claim 1 wherein the disilane-to-nitrous oxide ratio in the atmosphere is about 1 part of disilane to 203 parts of nitrous oxide, by volume.

4. The process for preparing high step coverage silicon dioxide coatings on semiconductor wafers in the manufacture of semiconductor devices comprising the steps of:

placing a silicon semiconductor wafer to be coated having surface discontinuities with a width/height aspect ratio of at least about 1.5 in a process chamber;

heating the wafer in the process chamber to a temperature of from about 200° C. to about 400° C. and maintaining said temperature during the deposition of silicon dioxide;

maintaining the pressure in the process chamber at from about 1 to 3 torr during the deposition of silicon dioxide;

introducing a mixture consisting essentially of disilane and nitrous oxide into the process chamber and maintaining the wafer in an atmosphere consisting essentially of a gaseous mixture of disilane and nitrous oxide; and initiating and maintaining plasma enhanced chemical vapor deposition of silicon dioxide from said gaseous mixture by applying radio frequency energy at about 0.04 W/cm$^2$ to the wafer to create a plasma adjacent the surface of said wafer to produce a coating having a high step coverage of at least about 0.7 at an aspect ratio on the wafer of 1.5 or greater.

5. The process of claim 4 wherein the disilane-to-nitrous oxide ratio in the atmosphere is bout 1 part of disilane to 203 parts of nitrous oxide, by volume.

* * * * *